United States Patent
Rangel et al.

(10) Patent No.: US 12,036,890 B2
(45) Date of Patent: Jul. 16, 2024

(54) METHOD AND SYSTEM FOR PREDICTING BATTERY HEALTH WITH MACHINE LEARNING MODEL

(71) Applicant: Guangzhou Automobile Group Co., Ltd., Guangdong (CN)

(72) Inventors: Tonatiuh Rangel, Los Gatos, CA (US); Yizhen Zhang, San Jose, CA (US); Dao Hoang Ho, Milpitas, CA (US); Ying Fu, Guangdong (CN); Yonggang Xu, Los Gatos, CA (US)

(73) Assignee: GUANGZHOU AUTOMOBILE GROUP CO., LTD., Guangzhou (CN)

( * ) Notice: Subject to any disclaimer, the term of this patent is extended or adjusted under 35 U.S.C. 154(b) by 827 days.

(21) Appl. No.: 16/952,097

(22) Filed: Nov. 19, 2020

(65) Prior Publication Data

US 2022/0153166 A1    May 19, 2022

(51) Int. Cl.
| | |
|---|---|
| *B60L 58/16* | (2019.01) |
| *B60L 3/12* | (2006.01) |
| *B60L 58/12* | (2019.01) |
| *G01R 31/367* | (2019.01) |
| *G01R 31/382* | (2019.01) |
| *G01R 31/392* | (2019.01) |

(52) U.S. Cl.
CPC ............... *B60L 58/16* (2019.02); *B60L 3/12* (2013.01); *B60L 58/12* (2019.02); *G01R 31/367* (2019.01); *G01R 31/382* (2019.01); *G01R 31/392* (2019.01)

(58) Field of Classification Search
CPC .. B60L 58/16; B60L 3/12; B60L 58/12; B60L 2240/545; B60L 2240/547; B60L 2260/46; B60L 2260/52; B60L 2260/54; G01R 31/367; G01R 31/382; G01R 31/392
USPC .......................................................... 429/90
See application file for complete search history.

(56) References Cited

U.S. PATENT DOCUMENTS

2016/0349330 A1* 12/2016  Barfield, Jr. ......... G01R 31/389

FOREIGN PATENT DOCUMENTS

| CN | 103337882 B | 12/2016 |
|---|---|---|
| CN | 107991968 A | 5/2018 |

* cited by examiner

*Primary Examiner* — Wyatt P McConnell
(74) *Attorney, Agent, or Firm* — ScienBiziP, P.C.

(57) ABSTRACT

A method and a system for predicting battery health based on distance driven on a full battery load with machine learning model are provided. The method includes: obtaining historical vehicle telematics of vehicles, wherein the historical vehicle telematics comprise at least one of the following: odometer readings, battery SOC, vehicle speed, battery-module temperatures, and battery-cell voltages; creating a distance driven model according to a relationship between a distance driven on a full battery load of vehicles and the historical vehicle telematics; obtaining a distance driven on a full battery load of a vehicle based on the distance driven model by using real-time vehicle telematics of the vehicle as model input; predicting battery health of the vehicle by comparing the obtained distance with a reference distance value.

14 Claims, 5 Drawing Sheets

METHOD AND SYSTEM FOR PREDICTING BATTERY HEALTH WITH MACHINE LEARNING MODEL

TECHNICAL FIELD

The present disclosure relates to the field of battery modeling and battery health monitoring, and particularly to a method and system for predicting battery health based on distance driven on a full battery load with machine learning model, a storage medium and an electric vehicle.

BACKGROUND

Telematics data from electric vehicles makes it possible to remotely monitor power battery pack performance for maintenance and to prevent a major battery health problem or a costly battery replacement. The challenge is to develop system and method to enable such capacities.

In related art, several previous works to monitor battery health involve on board vehicle monitoring systems to diagnose vehicle part conditions and transfer vehicle status information via telematics, The engine status data are transferred to an external database, and from historical data on multiple vehicles normal conditions are established. The latter allows to monitor individual vehicles by comparing its data to the database. And in another related art, a vehicle's health monitoring system is proposed in which data from vehicle's open circuit voltage and usage is sent to a device to calculate vehicle's health and compare it to tabulated values, when the signal lays outside a predefined range then an alert can be issued.

It is to be noted that the information disclosed in this background of the disclosure is only for enhancement of understanding of the general background of the present disclosure and should not be taken as an acknowledgement or any form or suggestion that this information forms the prior art already known to a person skilled in the art.

SUMMARY

Embodiments of the present disclosure provide a method and system for predicting battery health based on distance driven on a full battery load with machine learning model, a storage medium and an electric vehicle, and improve the accuracy of predicting the battery health of vehicles.

The embodiments of the present disclosure propose a modeling and monitoring method based on distance driven on a full battery load. Compared to other metrics such as battery capacity in ampere hour (Ah), distance driven is a metric an average customer can experience and make sense of easily, and it is of more practical importance. However, a distance driven is impacted by many factors besides battery capacity, such as environmental, vehicle mechanical, and driver behavioral factors. The disclosure is on method and system to factor out those influences via machine learning methods. The model compensated distance driven metric can then reliably measure the battery health.

According to one aspect of the present disclosure, a method for predicting battery health with machine learning model is provided. The method comprises the following steps: obtaining historical vehicle telematics of vehicles, wherein the historical vehicle telematics comprise at least one of the following: odometer readings, battery state-of-charge (SOC), vehicle speed, battery-module temperatures, and battery-cell voltages; creating a distance driven model according to a relationship between a distance driven on a full battery load of vehicles and the historical vehicle telematics; obtaining a distance driven on a full battery load of a vehicle based on the distance driven model by using real-time vehicle telematics of the vehicle as model input; predicting battery health of the vehicle by comparing the obtained distance with a reference distance value.

In an exemplary embodiment, creating a distance driven model according to a relationship between a distance driven on a full battery load of vehicles and the historical vehicle telematics comprises: identifying trips on battery from the historical vehicle telematics of vehicles; extracting at least one of the following model features from the historical vehicle telematics: positive/negative acceleration counts, mean vehicle speed, mean battery temperature, battery temperature imbalance, regenerated energy, mean cell-voltage difference, and cumulative distance; modeling distance driven according to the relationship between the distance driven on a full battery load and the model features.

In an exemplary embodiment, after creating the distance driven model, the method further comprises: training the distance driven model based on historical data of vehicles to provide a predictive general model; training individual-vehicle models for different vehicles by using the predictive general model coefficients as a starting point.

In an exemplary embodiment, before modeling distance driven on a full battery load of vehicles, the method further comprises: scaling distance driven, positive/negative acceleration counts and regenerated energy for each trip based on SOC change.

In an exemplary embodiment, before obtaining a distance driven on a full battery load of a vehicle based on the distance driven model by using real-time vehicle telematics of the vehicle as model input, the method further comprises: collecting the real-time vehicle telematics from the vehicle at a preset frequency.

In an exemplary embodiment, wherein obtaining the distance driven on a full battery load of a vehicle based on the distance driven model by using real-time vehicle telematics of the vehicle as model input, comprises at least one of the following: obtaining changes in distance driven due to trip, specifics according to the following model features: positive/negative acceleration counts, mean vehicle speed, and regenerated energy; obtaining changes in distance driven due to seasonal temperature fluctuations as claimed in the following model features: mean battery temperature, and battery temperature imbalance; obtaining changes in distance driven due to long-term loss of battery health according to the following model features: mean cell-voltage difference, and cumulative distance.

In an exemplary embodiment, wherein the loss of distance driven with time is proportional to cumulative usage and mean cell-voltage difference.

In an exemplary embodiment, wherein the relationship between the distance driven on a full battery load and the model features is determined by the following linear regression formula:

$$y = \theta^t X$$

where y is the distance driven on in a trip, X is at least one of the model features, $\theta$ is the corresponding model coefficient, and $\theta^t$ is the matrix transpose of $\theta$.

In an exemplary embodiment, after predicting battery health of the vehicle by comparing the predictive distance with a reference distance value, the method further comprises: sending an alarm when the battery health of the vehicle lies below a preset threshold.

According to another aspect of the present disclosure, a system for predicting battery health with machine learning model is also provided. The system comprises: a first obtaining module, configured to obtain historical vehicle telematics of vehicles, wherein the historical vehicle telematics comprise at least one of the following: odometer readings, battery state-of-charge (SOC), vehicle speed, battery-module temperatures, and battery-cell voltages; a creation module, configured to create a distance driven model according to a relationship between a distance driven on a full battery load of vehicles and the historical vehicle telematics; a second obtaining module, configured to obtain a distance driven on a full battery load of a vehicle based on the distance driven model by using real-time vehicle telematics of the vehicle as model input; a prediction module, configured to predict battery health of the vehicle by comparing the obtained distance with a reference distance value.

In an exemplary embodiment, the system further comprises a sending module, configure to send an alarm when the battery health of the vehicle lies below a preset threshold.

According to another aspect of the present disclosure, a non-volatile computer readable storage medium is also provided. A program is stored in the non-volatile computer readable storage medium, and the program is configured to be executed by a computer to perform the steps of methods in above-mentioned embodiments.

According to another aspect of the present disclosure, an electric vehicle is also provided. The electric vehicle includes the system for predicting battery health with machine learning model in above-mentioned embodiments.

In the above-mentioned embodiments of the present disclosure, utilizing interpretable machine learning models to monitor vehicle's battery health, the vehicle-internal apparatus is not required to measure battery health, and it derives battery health through machine learning models instead. Moreover, insights on the factors contributing to a loss in battery performance are provided.

BRIEF DESCRIPTION OF THE DRAWINGS

The drawings described here are adopted to provide a further understanding to the present disclosure and form a part of the application. Schematic embodiments of the present disclosure and descriptions thereof are adopted to explain the present disclosure and not intended to form limits to the present disclosure. In the drawings.

DETAILED DESCRIPTION OF THE EMBODIMENTS

The present disclosure will be described below with reference to the drawings and in combination with the embodiments in detail. It is to be noted that the embodiments in the application and characteristics in the embodiments may be combined without conflicts.

Embodiment 1

In the present embodiment, a method for predicting battery health with machine learning model is provided by the present embodiment. In the present embodiment, the data-driven solution utilizes interpretable machine learning models to monitor vehicle's battery health. Data from battery management system (BMS) including voltage, current, temperature, state-of-charge, and vehicle speed and odometer readings is collected into a central database. The method does not require vehicle-internal apparatus to measure battery health but instead derives battery health through machine learning models. Moreover, the method provides insights on the factors contributing to a loss in battery performance such as temperature, battery-cell voltage imbalance and usage. The data-driven solution allows the manufacturer to monitor battery health of production vehicles in real time.

Figure 1:
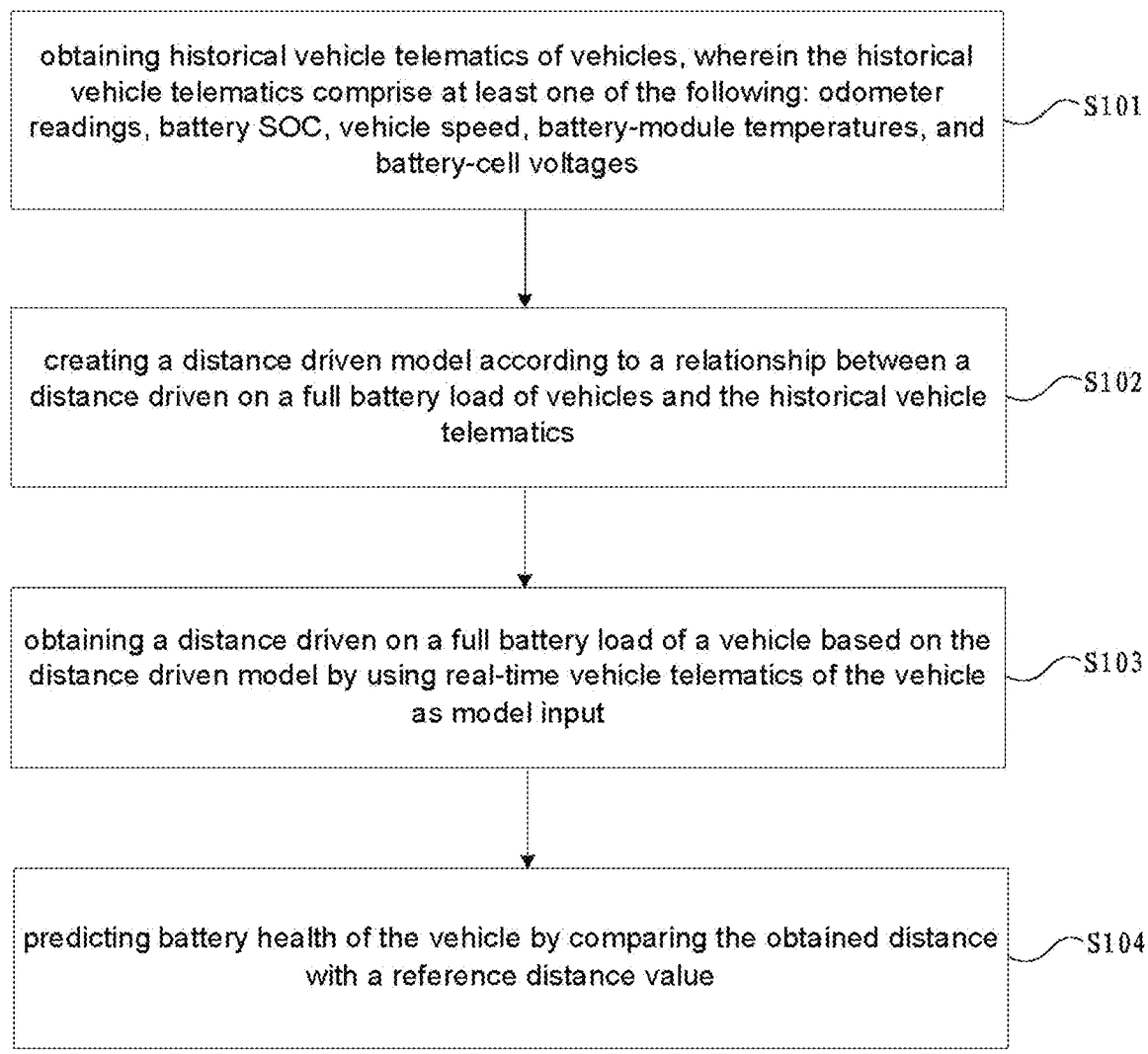
FIG. 1 is a flowchart of a method for predicting battery health according to an embodiment of the present disclosure.

As shown in FIG. 1, the method includes the following steps.

At S101, obtaining historical vehicle telematics of vehicles, wherein the historical vehicle telematics comprise at least one of the following: odometer readings, battery state-of-charge (SOC), vehicle speed, battery-module temperatures, and battery-cell voltages;

At S102, creating a distance driven model according to a relationship between a distance driven on a full battery load of vehicles and the historical vehicle telematics;

At S103, obtaining a distance driven on a full battery load of a vehicle based on the distance driven model by using real-time vehicle telematics of the vehicle as model input;

At S104, predicting battery health of the vehicle by comparing the obtained distance with a reference distance value.

In the present embodiment, at the step of S102, the method may further comprise: identifying trips on battery from the historical vehicle telematics of vehicles; extracting at least one of the following model features from the historical vehicle telematics: positive/negative acceleration counts, mean vehicle speed, mean battery temperature, battery temperature imbalance, regenerated energy, mean cell-voltage difference, and cumulative distance; modeling distance driven according to the relationship between the distance driven on a full battery load and the model features.

In the present embodiment, after the step of S102, the method may further comprises: training the distance driven model based on historical data of vehicles to provide a predictive general model; training individual-vehicle models for different vehicles by using the predictive general model coefficients as a starting point.

In the present embodiment, before modeling distance driven on a full battery load of vehicles, the method may further comprise: scaling distance driven, positive/negative acceleration counts, and regenerated energy for each trip based on SOC change.

In the present embodiment, before the step of S103, the method may further comprise: collecting the current vehicle telematics from the vehicle at a preset frequency.

In the present embodiment, the step of S103 may comprises at least one of the following: predicting changes in distance driven due to trip specifics according to the following features: positive/negative acceleration counts, mean vehicle speed, and regenerated energy; predicting changes in distance driven due to seasonal temperature fluctuations according to the following features: mean battery temperature, and battery temperature imbalance; predicting changes in distance driven due to long-term loss of battery health according to the following features: mean cell-voltage difference, and cumulative distance.

In the present embodiment, wherein the loss of distance driven with time is proportional to cumulative usage and mean cell-voltage difference.

In the present embodiment, wherein the distance driven can be determined by the following linear regression formula:

$$y = \theta^t X$$

where the target vector y is distance driven in a trip, and X is the model feature or the combination of a plurality of model features, $\theta$ is the corresponding model coefficient, and $\theta^t$ is the matrix transpose of $\theta$.

In the present embodiment, after the step of S104, the method may further comprise: sending an alarm when the battery health of the vehicle lies below a preset threshold.

In the present embodiment, when battery health lies below a predefined threshold, an alarm is issued, and the manufacturer can recall the vehicle for predictive repairs or over-the-air vehicle software update as needed. Therefore, the customers receive in time maintenance to prevent major battery problems or battery replacements, to potentially increase vehicle battery life time, to improve customer satisfaction, and to cut manufacturer warranty cost.

Embodiment 2

In the present embodiment, provided are machine learning models for the real-time monitoring of vehicle battery health based on vehicle telematics for personalized-vehicle care and preventive maintenance.

Figure 2:
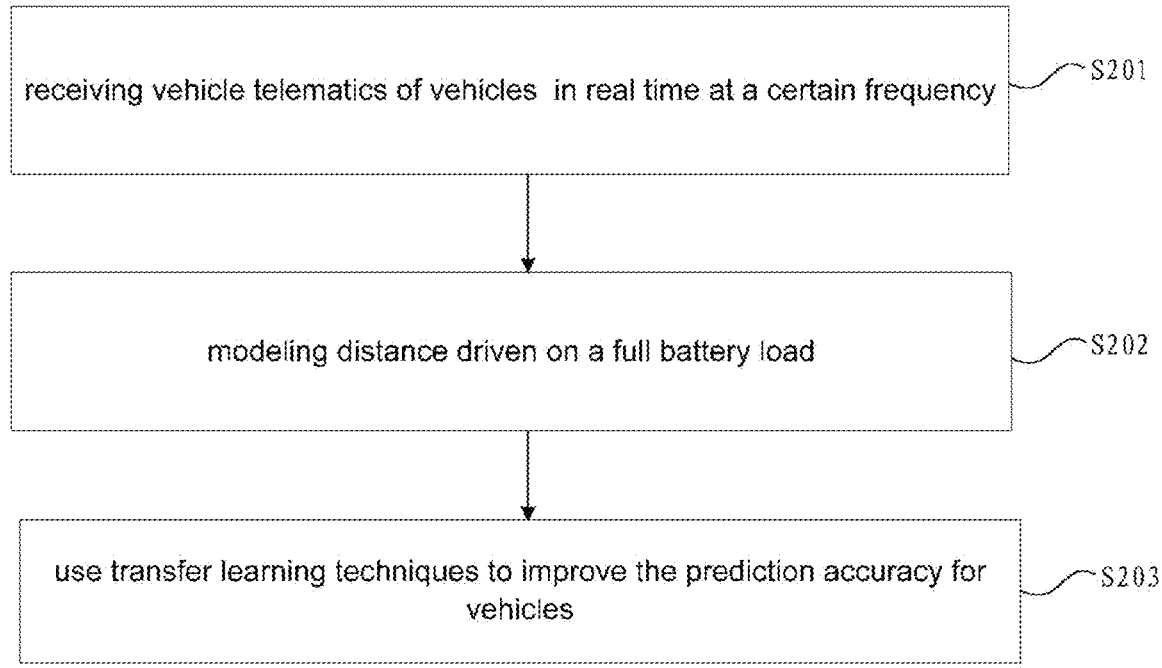
FIG. 2 is a flowchart of a method for predicting battery health according to another embodiment of the present disclosure.

FIG. 2 is a flowchart of method for predicting battery health with machine learning models according to an embodiment of the present disclosure. As shown in FIG. 2, the method includes the following steps.

At S201, receiving vehicle telematics of vehicles (for example pure electric or hybrid electric vehicles) in real time at a certain frequency (for example 10 s). In the present embodiment, the telematic signals received may include odometer readings, battery state-of-charge (Sac), vehicle speed, battery-module temperatures, and battery-cell voltages.

Figure 3:
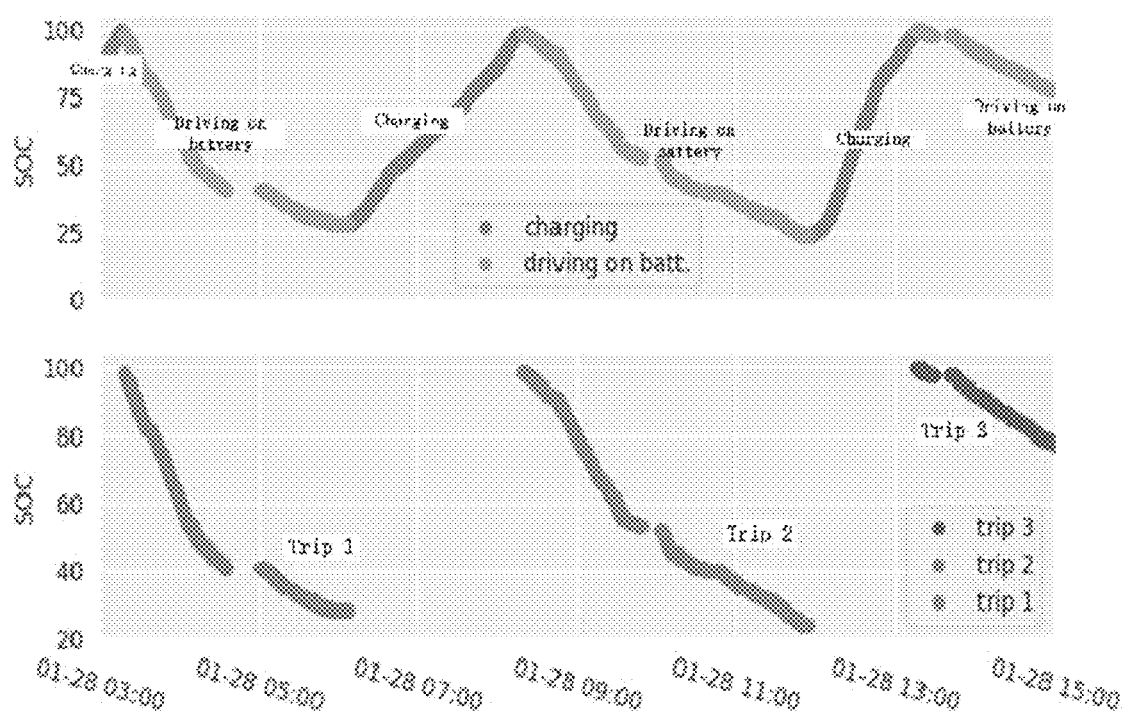
FIG. 3 is a schematic diagram of time series of vehicle telematics according to an embodiment of the present disclosure.

FIG. 3 is typical telematics of SOC signals for a single vehicle in one day for a pure-electric vehicle. As shown in the top panel of FIG. 3, from vehicle speed and battery-related signals, it is determined whether the vehicle is driving on battery or charging. In the bottom panel of FIG. 3, trips are extracted, defined as segments for a vehicle that is driving on battery.

With the above definition of trips-on-battery, key metrics are utilized to describe battery performance per trip on a full battery load, as, described next.

At S202, modeling distance driven on a full battery load.

In the present embodiment, after having identified trips on battery from vehicle telematics, one can proceed to model distance-driven on a full battery load, a common metric of battery performance. The key features used for modeling purposes are shown in Table 1 below.

TABLE 1

| Feature | Description |
| --- | --- |
| Positive/negative acceleration counts | Counts of records with positive/negative vehicle acceleration in a trip |
| Mean vehicle speed | Mean value of vehicle speed in a trip |
| Mean battery temperature | Mean value of battery temperature in a trip |
| Battery-module temperature imbalance | Maximum temperature imbalance between battery modules in a trip |
| Regenerated energy | Energy regenerated in a trip (e.g., during braking) |
| Mean cell-voltage difference | Mean value of maximum voltage-difference between two battery cells |
| Cumulative distance | Cumulative distance driven on battery |

Then scale distance driven, positive/negative acceleration counts and regenerated energy for each trip to 100 SOC, by multiplying a normalization constant of 100/ΔSOC, where ΔSOC is the net change in SOC in the trip.

At S203, use transfer learning techniques to improve the prediction accuracy for vehicles.

In the present embodiment, at first train a fleet model with all historical data for all vehicles of a fleet to provide a predictive general model for the fleet. The fleet model coefficients are then used as a starting point to train individual-vehicle (VIN) models, in which a different model is constructed for each vehicle to improve the model performance at the individual level.

Then linear regression models are utilized for their interpretability and good performance in this case. Table 2 shows root-mean squared error (RMSE) and $R^2$ of about 120000 trips sampled from about 5000 vehicles. A fleet-model trained on all vehicles achieves an $R^2$ of 0.83, which is further improved with personalized vehicle (VIN) models to a collective $R^2$ of 0.90. More sophisticated algorithms achieve similar scores, e.g., a fully connected neural network with 2 hidden layers and a tanh activation function achieves $R^2$ of 0.92.

TABLE 2

| | RMSE (km) | $R^2$ |
| --- | --- | --- |
| Fleet model | 23.81 | 0.83 |
| VIN models | 19.83 | 0.90 |
| Neural network | 19.0 | 0.92 |

As shown in the table above machine learning models can describe distance driven on a full charge with high accuracy up to a variance score of 0.90. Besides predicting distance-driven, machine learning models provide insights into the physical factors leading to changes in distance driven over time.

In the present embodiment, to get insights on the factors affecting distance driven in a trip, a linear model is utilized with interpretable features, as described above. We only include features in the model with specific purpose, as explained in Table 3 below.

TABLE 3

| Purpose | Features |
| --- | --- |
| To describe changes in distance driven due to trip specifics | 1. Positive/negative acceleration counts<br>2. Mean vehicle speed<br>3. Regenerated energy |
| To describe changes in distance driven due to seasonal temperature fluctuations | 4. Mean battery temperature<br>5. Battery temperature imbalance |

TABLE 3-continued

| Purpose | Features |
| --- | --- |
| To describe changes in distance driven due to long-term loss of battery health | 6. Mean cell-voltage difference 7. Cumulative distance driven on battery |

Note that model features may depend on vehicle and battery types. For example, distinct vehicle types may show different correlation between battery temperature and external temperature. For most vehicle types, we use the seven features described in the table above, adding second-order terms for mean battery-temperature and mean vehicle speed to count for a quadratic dependence of distance-driven with temperature and speed.

With the linear regression below, the embodiment aims to explain variations in distance driven D by trip specifics, seasonal factors, and battery-health.

$$y = \theta^t X$$

where the target vector y is distance driven in a trip, and x is a model feature or the combination of a plurality model features, $\theta$ is a corresponding model coefficient to be determined, and $\theta^t$ is the matrix transpose of $\theta$.

In summary, the present embodiment builds a linear model with interpretable features, which provides insights on factors affecting changes in distance driven, including trips specifics, environmental factors, and battery degradation related factors. The latter can be used for predicting battery health, as described later.

The present embodiment finds a nearly quadratic dependence between battery temperature and distance driven on a full load for one type of vehicles studied. Therefore, the linear and quadratic temperature terms are included in the model to describe seasonal fluctuations of distance driven due to temperature as, $$S(t) = k_1 + k_2 T_{avg}(t) + k_3 T_{avg}(t)^2 + k_4 T_{diff}(t)$$

where $k_i$ are constants to be found, and $T_{avg}(t)$, $T_{diff}(t)$ are the battery temperature average and battery module temperature imbalance at trip t, respectively. Since seasonal effects are relative to an offset value $k_i$, in practice we set this relative to the value which maximizes S(t), found with S'(t)=0.

In the model of the present embodiment, the loss of distance driven with time (degradation D(t)) is proportional to cumulative usage (cumulative distance driven on battery U(t)) and mean cell-voltage difference $V_{diff}(t)$. Assuming a linear dependence of degradation with U(t) and $V_{diff}(t)$, $$D(t) = -(c_0 + c_1 U(t) + c_2(V_{diff}(t) - V_{diff}^0))$$

where D(t) is degradation at a given trip t, $V_{diff}^0$ is a nominal value for cell voltage difference (the expected $V_{diff}$ for a vehicle in optimal conditions), and $c_i$ are coefficients to be determined. Note the minus sign is used here for sign convention.

Degradation at the beginning of time is zero (e.g., for a new battery D(t=0)=0). Similarly, usage and $v_{diff}$ for a new battery are zero U(t=0)=0, $V_{diff}(t=0)=V_{diff}^0$, therefore $$c_0 + c_1 U(t=0) + c_2(V_{diff}(t=0) - V_{diff}^0) = 0,$$

leading to $c_0 = 0$, such that $$D(t) = -(c_1 U(t) + c_2(V_{diff}(t) - V_{diff}^0))$$

This implies that degradation D for trip t is solely determined on model coefficients for usage, cell-voltage difference, and a reference $V_{diff}^0$ value, but does not depend on any constant (intercept). In the above equation the first term $c_1 u(t)$ describes degradation due to battery cumulative usage for trip t, and the second term $c_2(V_{diff}(t) - V_{diff}^0)$ is interpreted as degradation due to cell-voltage difference.

Battery state-of-health (SOH) is estimated from the loss of distance driven at time t, y(t), with respect to distance driven at t=0, $y_0$, with $$SOH(t) = \frac{y(t)}{y_0}$$

Assuming fixed trip factors and seasonal conditions, the loss of distance driven with time is only due to battery degradation. Therefore, $$\hat{y}(t) = \hat{y}(t=0) - D(t)$$

where $\hat{y}(t)$ is the model predicted distance driven.

With such definition, we can easily estimate SOH with the model prediction as $$SOH(t) = \frac{\hat{y}(t)}{\hat{y}(t=0)} = \frac{\hat{y}(t)}{\hat{y}(t) + D(t)}$$

To validate the model in the present embodiment, the SOH predicted with the models can be compared with a reference value as below.

$$SOH^{ref.}(t) = \frac{\int I(t')dt'}{Ah^{ref.}}$$

The above can be obtained by integrating battery current I(t) over time during a full battery charging or discharging period and divided by the nominal capacity $Ah^{ref}$. It is found that the SOH values estimated from the models have good agreement with the reference SOH values for most vehicles with a mean root mean squared error of 0.07 in SOH units (SOH takes values from 0 to 1). The remaining disagreement is explained by noise in the reference SOH, and lack of enough data for certain vehicles to train the model.

Moreover, the model provides a decomposition of factors explaining the loss of battery health over time in units of SOH or km. This decomposition can give insights on the causes leading to battery degradation and can be used for the design of specific maintenance strategies. For example, whenever the SOH loss is found to be mostly caused by an increase of cell-voltage difference over time, a software and/or hardware update to reduce cell-voltage difference is likely to have a positive impact on battery health.

Figure 4:
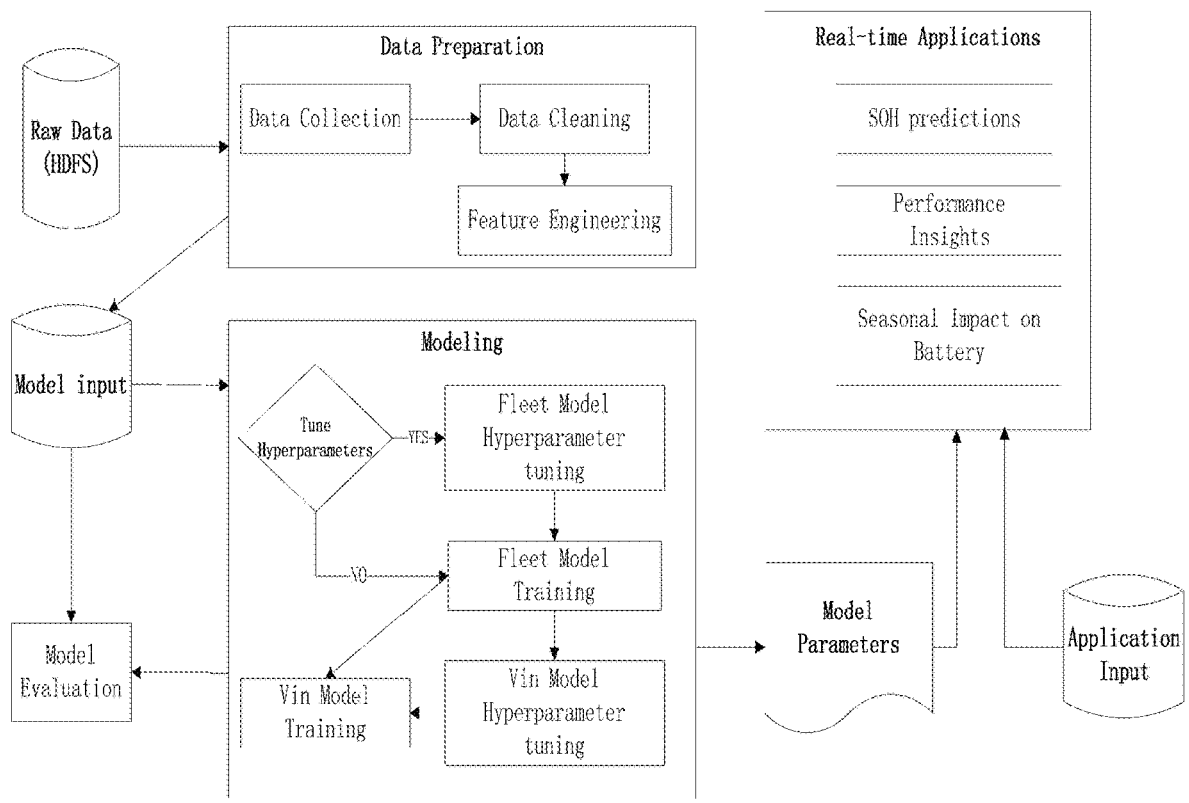
FIG. 4 is the data pipelines according to an embodiment of the present disclosure.

In the present embodiment, FIG. 4 shows the data pipelines of the method. Raw data is collected from vehicles at a predetermined frequency through vehicle telematics. The data is stored in a centralized platform. Data is cleaned and processed to build the model's input. Model hyper parameters are tuned automatically using cross-validation performance scores. After the model is trained, battery health can be predicted, which provides insights on performance loss due to battery degradation or seasonal effects. The model is updated in real-time as new data is collected and so are the model predictions. Model results are shown in a visualization platform for the manufacturer quality department to monitor vehicles performance in real time.

Embodiment 3

In the present embodiment, a system for predicting battery health with machine learning models is also provided. The system can be applied to a cloud-based server or an on-board computing device and is configured to implement the abovementioned embodiments with preferred implementation modes. What has been described will not be elaborated. For example, term "module", used below, may be a combination of software and/or hardware realizing a predetermined function. Although the device described in the following embodiment is preferably implemented by the software, implementation by the hardware or the combination of the software and the hardware is also possible and conceivable.

Figure 5:
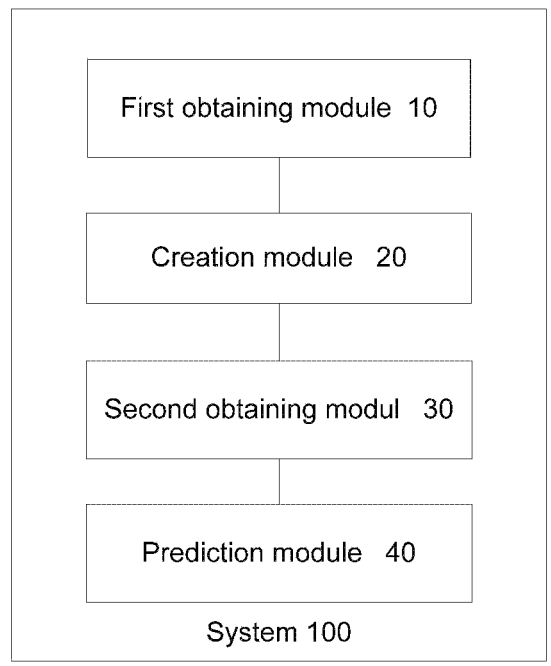
FIG. 5 is a structure block diagram of a system for predicting battery health according to another embodiment of the present disclosure.

FIG. 5 is a structure block diagram of a system for predicting battery health with machine learning models according to an embodiment of the present disclosure. As shown in FIG. 5, the system 100 includes a first obtaining module 10, a creation module 20, a second obtaining module 30, and a prediction module 40.

The first obtaining module 10 is configured to obtain historical vehicle telematics of vehicles, wherein the historical vehicle telematics comprise at least one of the following: odometer readings, battery state-of-charge (SOC), vehicle speed, battery-module temperatures, and battery-cell voltages.

The creation module 20 is configured to create a distance driven model according to a relationship between a distance driven on a full battery load of vehicles and the historical vehicle telematics;

The second obtaining module 30 is configured to obtain a distance driven on a full battery load of a vehicle based on the distance driven model by using real-time vehicle telematics of the vehicle as model input;

The prediction module 40 is configured to predict battery health of the vehicle by comparing the obtained distance with a reference distance value.

Embodiment 4

According to the present embodiment, a non-volatile computer readable storage medium is provided, a program is stored in the non-volatile computer readable storage medium, and the program is configured to be executed by a computer to perform the following steps:

At S1, obtaining historical vehicle telematics of vehicles, wherein the historical vehicle telematics comprise at least one of the following: odometer readings, battery state-of-charge (SOC), vehicle speed, battery-module temperatures, and battery-cell voltages;

At S2, creating a distance driven model according to a relationship between a distance driven on a full battery load of vehicles and the historical vehicle telematics;

At S3, obtaining a distance driven on a full battery load of a vehicle based on the distance driven model by using real-time vehicle telematics of the vehicle as model input;

At S4, predicting battery health of the vehicle by comparing the obtained distance with a reference distance value.

In an example embodiment, the storage medium may include, but not limited to, various media capable of storing program codes such as a U disk, a ROM, a RAM, a mobile hard disk, a magnetic disk or an optical disk.

Embodiment 5

Figure 6:
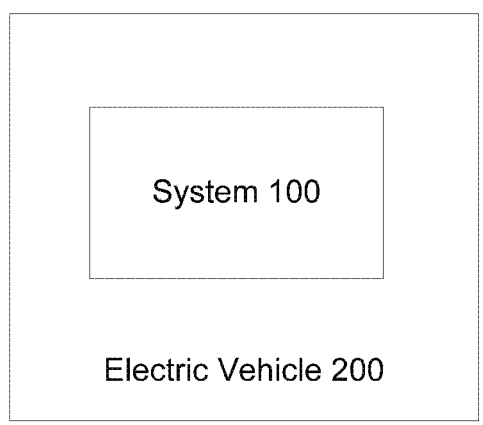
FIG. 6 is a structure block diagram of an electric vehicle according to an embodiment of the present disclosure.

According to the present embodiment, an electric vehicle is provided. As shown in FIG. 6, the electric vehicle 200 includes the system for predicting battery health with machine learning models in above-mentioned embodiments. It is to be noted that in the present embodiment the electric vehicle can be any kind of new energy vehicles (NEVs), such as EV (Electric Vehicle), HEV (Hybrid Electric Vehicle), and PHEV (Plug-in Hybrid Electric Vehicle).

It is apparent that those skilled in the art should know that each module or each step of the present disclosure may be implemented by a universal computing device, and the modules or steps may be concentrated on a single computing device or distributed on a network formed by a plurality of computing devices, and may in an embodiment be implemented by program codes executable for the computing devices, so that the modules or the steps may be stored in a storage device for execution with the computing devices, the shown or described steps may be executed in sequences different from those described here in some circumstances, or may form individual integrated circuit module respectively, or multiple modules or steps therein may form a single integrated circuit module for implementation. Therefore, the present disclosure is not limited to any specific hardware and software combination.

The above is only the exemplary embodiments of the present disclosure and not intended to limit the present disclosure. For those skilled in the art, the present disclosure may have various modifications and variations. Any modifications, equivalent replacements, improvements, and the like made within the principle of the present disclosure shall fall within the scope of protection of the present disclosure.

What is claimed is:

1. A method for predicting battery health with machine learning model, comprising:
   obtaining historical vehicle telematics of vehicles, wherein the historical vehicle telematics comprise at least one of the following: odometer readings, battery state-of-charge (SOC), vehicle speed, battery-module temperatures, and battery-cell voltages;
   creating a distance driven model according to a relationship between a distance driven on a full battery load of vehicles and the historical vehicle telematics;
   obtaining a distance driven on a full battery load of a vehicle based on the distance driven model by using real-time vehicle telematics of the vehicle as model input; and
   predicting battery health of the vehicle by comparing the obtained distance with a reference distance value;
   creating a distance driven model according to a relationship between a distance driven on a full battery load of vehicles and the historical vehicle telematics comprises:
   identifying trips on a battery from the historical vehicle telematics of vehicles;
   extracting at least one of the following model features from the historical vehicle telematics: positive/negative acceleration counts, a mean vehicle speed, a mean battery temperature, battery temperature imbalance, regenerated energy, a mean cell-voltage difference, and a cumulative distance; and
   modeling the distance driven according to the relationship between the distance driven on a full battery load and the model features extracted from the historical vehicle telematics.

2. The method as claimed in claim 1, after creating the distance driven model, the method further comprises:
   training the distance driven model based on historical data of vehicles to provide a predictive general model; and training individual-vehicle models for different vehicles by using predictive general model coefficients as a starting point.

3. The method as claimed in claim 1, before modeling distance driven on a full battery load of vehicles, the method further comprises:
   scaling the distance driven, the positive/negative acceleration counts and the regenerated energy for each of the trips based on SOC change.

4. The method as claimed in claim 1, before obtaining a distance driven on a full battery load of a vehicle based on the distance driven model by using real-time vehicle telematics of the vehicle as model input, the method further comprises:
   collecting the real-time vehicle telematics from the vehicle at a preset frequency.

5. The method as claimed in claim 1, wherein obtaining the distance driven on a full battery load of a vehicle based on the distance driven model by using real-time vehicle telematics of the vehicle as model input, comprises at least one of the following:
   obtaining changes in distance driven due to trip specifics according to the following model features: positive/negative acceleration counts, a mean vehicle speed, and regenerated energy;
   obtaining changes in distance driven due to seasonal temperature fluctuations as claimed in the following model features: the mean battery temperature, and the battery temperature imbalance; and
   obtaining changes in distance driven due to long-term loss of battery health according to the following model features: the mean cell-voltage difference, and the cumulative distance.

6. The method as claimed in claim 5, wherein a loss of distance driven with time is proportional to a cumulative usage and the mean cell-voltage difference.

7. The method as claimed in claim 1, wherein the relationship between the distance driven on a full battery load and the historical vehicle telematics is determined by the following linear regression formula:

$$y = \theta^t X$$

where y is a distance driven on in a trip, X is at least one of the model features from the historical vehicle telematics, $\theta$ is a corresponding model coefficient, and $\theta^t$ is the matrix transpose of $\theta$.

8. The method as claimed in claim 1, after predicting battery health of the vehicle by comparing the predictive distance with a reference distance value, the method further comprises:
   sending an alarm when the battery health of the vehicle is below a preset threshold.

9. A non-volatile computer readable storage medium, in which a program is stored, the program is configured to be executed by a computer to perform the method as claimed in claim 1.

10. A non-volatile computer readable storage medium, in which a program is stored, the program is configured to be executed by a computer to perform the method as claimed in claim 2.

11. A non-volatile computer readable storage medium, in which a program is stored, the program is configured to be executed by a computer to perform the method as claimed in claim 3.

12. A non-volatile computer readable storage medium, in which a program is stored, the program is configured to be executed by a computer to perform the method as claimed in claim 4.

13. A non-volatile computer readable storage medium, in which a program is stored, the program is configured to be executed by a computer to perform the method as claimed in claim 5.

14. A non-volatile computer readable storage medium, in which a program is stored, the program is configured to be executed by a computer to perform the method as claimed in claim 6.

* * * * *